(12) United States Patent
Ivanov et al.

(10) Patent No.: US 10,033,342 B2
(45) Date of Patent: *Jul. 24, 2018

(54) NONLINEAR CLASS AB INPUT STAGE

(71) Applicant: Texas Instruments Incorporated, Dallas, TX (US)

(72) Inventors: Vadim V. Ivanov, Tucson, AZ (US); Ravinthiran Balasingam, Tucson, AZ (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/437,258

(22) Filed: Feb. 20, 2017

(65) Prior Publication Data

US 2017/0163230 A1    Jun. 8, 2017

Related U.S. Application Data

(63) Continuation of application No. 14/619,860, filed on Feb. 11, 2015, now Pat. No. 9,577,589.

(60) Provisional application No. 61/938,796, filed on Feb. 12, 2014.

(51) Int. Cl.
H03F 3/45    (2006.01)
H03G 3/30    (2006.01)
H03F 1/34    (2006.01)
H03F 3/21    (2006.01)

(52) U.S. Cl.
CPC ........... H03G 3/30 (2013.01); H03F 1/34 (2013.01); H03F 3/21 (2013.01); H03F 3/45273 (2013.01); H03F 2203/45116 (2013.01); H03F 2203/45264 (2013.01)

(58) Field of Classification Search
CPC . H03F 2200/126; H03F 2200/153; H03F 3/45
USPC .......................... 330/258, 259, 260; 323/282
See application file for complete search history.

(56) References Cited

U.S. PATENT DOCUMENTS 6,265,941 B1    7/2001    Lopata
6,459,338 B1    10/2002   Acosta et al.

OTHER PUBLICATIONS

Prosecution History from U.S. Appl. No. 14/619,860, dated Feb. 11, 2015 through Feb. 2, 2017, 106 pp.

Primary Examiner — Steven J Mottola
(74) Attorney, Agent, or Firm — John R. Pessetto; Charles A. Brill; Frank D. Cimino

(57) ABSTRACT

A circuit includes a differential input stage amplifier that receives a differential input voltage and generates an output voltage based on a difference in the differential input voltage. A feedback loop provides feedback from an output of the differential input stage amplifier to input tail current of the differential input stage amplifier. The feedback loop enables class AB operation of the differential input stage amplifier. At least one gain reducer is operatively coupled to the feedback loop to reduce the gain of the feedback loop. The gain reducer has a resistance value that varies inversely proportional to loop current in the feedback loop to reduce the gain of the feedback loop as loop current increases.

5 Claims, 3 Drawing Sheets

NONLINEAR CLASS AB INPUT STAGE

CROSS-REFERENCE TO RELATED APPLICATION

This application is a continuation of U.S. patent application Ser. No. 14/619,860 filed Feb. 11, 2015, which application claims the benefit of U.S. Provisional Patent Application 61/938,796 filed on Feb. 12, 2014, the entirety of both are incorporated by reference herein.

TECHNICAL FIELD

This disclosure relates to integrated circuits, and more particularly to a gain reduction and feedback circuit to facilitate stabilization of a nonlinear class AB input amplifier stage.

BACKGROUND

Class AB amplifiers provide a suitable compromise between linear class A operation with higher amplifier power dissipation and non-linear class B operation. One application for class AB amplifiers is with a low dropout linear regulator circuits which are also referred to as LDO's. In existing stand-alone LDO's, the output dynamic error should be kept within 150-200 mV when instantly switching load current from a few microamps to 100-150 mA, for example, which represents a large dynamic range. It is also desirable to keep LDO quiescent current (Iq), which is dominated by an error amplifier in the LDO, in the range of 100-200 nA if possible. To provide low Iq and dynamic error while controlling an output pass device of the LDO (e.g., pass device requires large current for dynamic charging/discharging of the gate capacitance of the pass device during load transient), 1000 times or more increase in tail current at 100-150 mV input error is generally required. Tail current is the current supplied to the input differential stage amplifier of the error amplifier in response to a differential voltage input. To achieve 1000 times increase in tail current, input error for the differential input stage should be on order of 500-600 mV. Some circuits require a minimum input voltage and provide more gain in the feedback loop to yield a somewhat sharper tail current boost—for example, 300-400 mV of input error yields 1000 times increase in tail current. Nonlinear operation provided by 300-400 mv input differential is still not sufficient however. To decrease the input differential even more, larger feedback loop gain may be required. Providing larger gain in the feedback loop can decrease amplifier stability however at some points of such a large dynamic range of load current.

SUMMARY

This disclosure relates to a gain reduction and feedback circuit to facilitate stabilization of a nonlinear class AB input amplifier stage. In one example, a circuit includes a differential input stage amplifier that receives a differential input voltage and generates an output voltage based on a difference in the differential input voltage. A feedback loop provides feedback from an output of the differential input stage amplifier to input tail current of the differential input stage amplifier. The feedback loop enables class AB operation of the differential input stage amplifier. At least one gain reducer is operatively coupled to the feedback loop to reduce the gain of the feedback loop. The gain reducer has a resistance value that varies inversely proportional to loop current in the feedback loop to reduce the gain of the feedback loop as loop current increases.

In another example, a circuit includes a differential input stage amplifier that receives a differential input voltage and generates an output voltage based on a difference in the differential input voltage. A negative feedback loop provides feedback from an output of the differential input stage amplifier to input tail current of the differential input stage amplifier. The negative feedback loop enables class AB operation of the differential input stage amplifier. A positive feedback loop provides feedback from an output of the differential input stage amplifier to input tail current of the differential input stage amplifier. The positive feedback loop reduces an amount of differential input voltage to initiate nonlinear operations of the differential input stage amplifier with respect to changes in the differential input voltage. At least one gain reducer is operatively coupled to the negative feedback loop or the positive feedback loop to reduce the gain of the negative feedback loop or the positive feedback loop respectively. The gain reducer has a resistance value that varies inversely proportional to loop current in the negative feedback loop or the positive feedback loop to reduce the gain of the respective loop as loop current increases.

In yet another example, a circuit includes a differential input stage amplifier that receives a differential input voltage and generates an output voltage based on a difference in the differential input voltage. A negative feedback loop provides feedback from an output of the differential input stage amplifier to input tail current of the differential input stage amplifier. The negative feedback loop enables class AB operation of the differential input stage amplifier. A positive feedback loop provides feedback from an output of the differential input stage amplifier to input tail current of the differential input stage amplifier. The positive feedback loop reduces an amount of differential input voltage to initiate nonlinear operations of the differential input stage amplifier with respect to changes in the differential input voltage. At least one gain reducer is operatively coupled to the negative feedback loop and the positive feedback loop to reduce the gain of the negative feedback loop and the positive feedback loop. The gain reducer has a resistance value that varies inversely proportional to loop current in the negative feedback loop and the positive feedback loop to reduce the gain of the respective loop as loop current increases. An output driver stage amplifies the output voltage from the differential input stage amplifier and generates an amplified output voltage to provide an operational amplifier output.

DETAILED DESCRIPTION

This disclosure relates to a gain reduction and feedback circuit to facilitate stabilization and tail current boost of a nonlinear class AB input amplifier stage. The class AB input amplifier stage includes a differential input stage amplifier that receives a differential input voltage and generates an output voltage based on a difference in the differential input voltage. In order to provide the most efficient operation of the stage, it is desirable to have sharp output transition at the lowest possible difference between the differential input voltages. To achieve this, large increases in tail current for the differential input stage are required in response to a minimum input voltage differential. In conventional circuits, negative feedback loop gain for the differential input stage is increased. By increasing loop gain of the feedback loop to provide such functionality however, leads to stability problems over the large dynamic range of load currents that are generated. To facilitate stability over the large dynamic range, a gain reducer (or reducers) can be coupled to the feedback loop in the differential input stage to dynamically reduce the gain of the feedback loop over the dynamic range. The gain reducer has a resistance value (e.g., 1/gm, where gm is a transconductance parameter) that varies inversely proportional to loop current in the feedback loop to reduce the gain of the feedback loop as loop current increases (e.g., the higher the loop current the lower the resistance value). In this manner, the loop can be stabilized. In another aspect, a positive feedback loop can be provided in addition to the negative feedback loop to facilitate nonlinear operation of the differential input stage. This includes boosting tail current with a lower amount of input voltage differential (e.g., providing 1000 times tail current boost with 100-120 mV differential input voltage as opposed to conventional circuit of 300-400 mV or larger).

Figure 1:
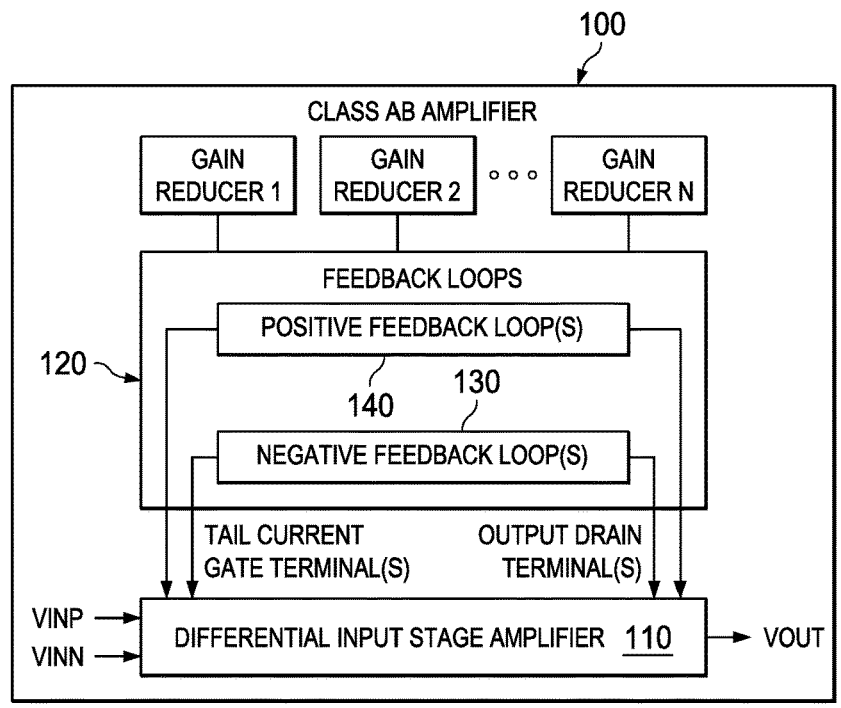
FIG. 1 illustrates an example of a class AB amplifier circuit that employs feedback loops and gain reducers to enhance stability and nonlinear operations of the circuit.

FIG. 1 illustrates an example of a class AB amplifier circuit 100 that employs feedback loops and gain reducers to enhance stability and nonlinear operations of the circuit. As used herein, the term circuit can include a collection of active and/or passive elements that perform a circuit function such as an analog circuit or control circuit, for example. The term circuit can also include an integrated circuit where all the circuit elements are fabricated on a common substrate, for example. A differential input stage amplifier 110 receives a differential input voltage shown as VINP and VINN (where P and N represent positive and negative) and generates an output voltage VOUT based on a difference in the differential input voltage. As will be shown in more detail with respect to FIGS. 4 and 5, the differential input stage amplifier 110 includes a differential pair of transistors that receives VINP and VINP, where the differential pair with the addition of negative and positive feedback loop adjusts its own tail current in response to a voltage difference between VINP and VINN. As used herein the term tail current refers to the combined currents in the source terminals of the differential pair of transistors in the differential input stage amplifier 110.

For efficient nonlinear class AB operations, it is desirable to generate the largest amount of tail current with the smallest amount of voltage differential between VINP and VINN. To achieve this, feedback loops 120 are provided. A negative feedback loop 130 provides feedback from an output of the differential input stage amplifier 110 to tail current input of the differential input stage amplifier. The negative feedback loop 130 enables class AB operation of the differential input stage amplifier 110. A positive feedback loop 140 provides feedback from an output of the differential input stage amplifier 110 to tail current input of the differential input stage amplifier. The positive feedback loop 140 reduces an amount of differential input voltage to initiate nonlinear operations of the differential input stage amplifier 110 with respect to changes in the differential input voltage VINP and VINN. For example by providing positive feedback to the feedback loops 120, conventional voltage differentials of 300-400 mV to generate 1000 times or more increase in tail current can be reduced to a range from about 100 to about 120 millivolts (mV), for example. The gain of the positive feedback loop 140 is typically set substantially smaller than that of the negative feedback loop. For example, the positive feedback loop gain may be one fourth (or less) than the gain set for the negative feedback loop.

To facilitate stability over a large dynamic range of load currents that are supported, one or more gain reducers shown as gain reducer 1 though N, where N is a positive integer, can be coupled to the feedback loop 120 in the differential input stage amplifier 110 to dynamically reduce the gain of the feedback loop over the dynamic range of load currents supported. The gain reducers 1 through N can be employed in either the negative feedback loop 130 and/or the positive feedback loop 140. The gain reducer has a resistance value (e.g., 1/gm) that varies inversely proportional to loop current in the feedback loop 120 to reduce the gain of the feedback loop as loop current increases (e.g., the higher the loop current the lower the resistance value). In this manner, the feedback loop 120 (or loops) can be stabilized. In one example, the gain reducer can be a diode and/or a transistor configured as a diode. The gain reducer can be placed in series with an amplifier stage to limit its current where its resistance can vary as loop current varies. In conventional circuits, fixed resistors were employed in place of the gain reducers where the fixed resistors had a constant and unvarying resistance as opposed to resistance to the gain reducer which reduces resistance with increasing current. As such, as load current increased over a large dynamic range in conventional circuits, instability could occur (e.g., ringing in the output) at larger increases in loop gain.

Figure 2:
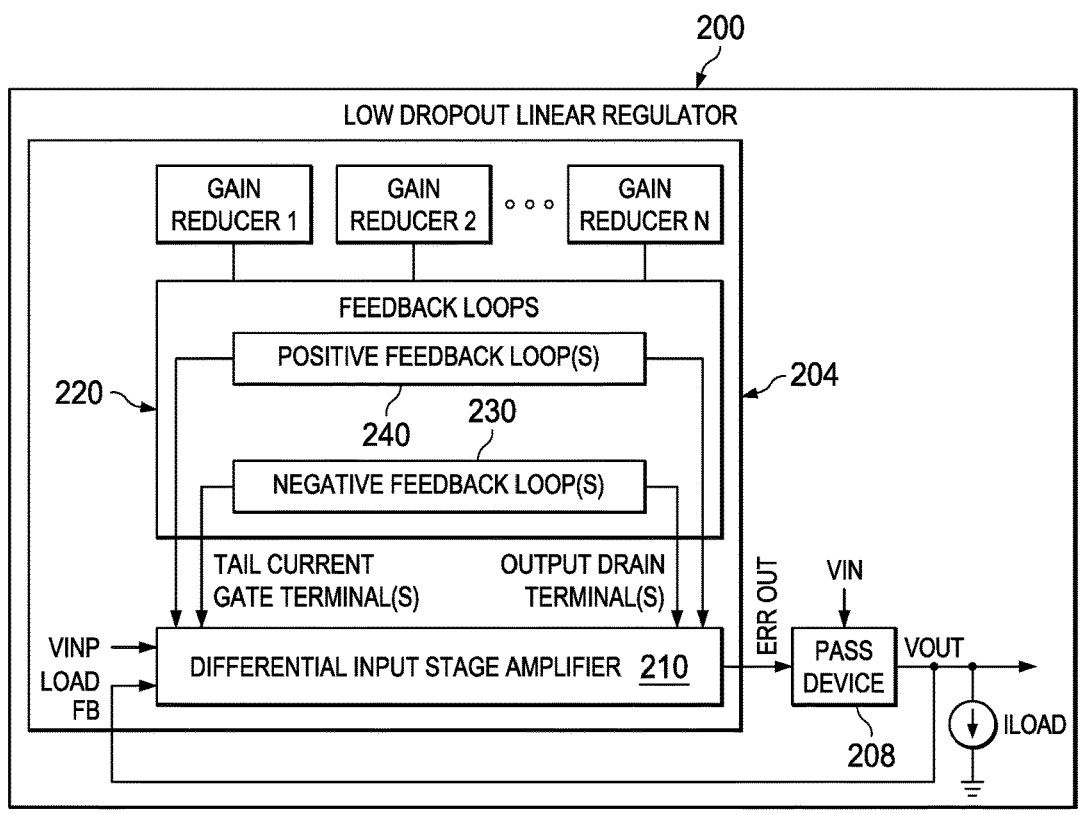
FIG. 2 illustrates an example of low dropout regulator having a class AB amplifier circuit that employs feedback loops and gain reducers to enhance stability and nonlinear operations of the circuit.

FIG. 2 illustrates an example of low dropout regulator 200 having a class AB amplifier circuit 204 that employs feedback loops and gain reducers to enhance stability and nonlinear operations of the circuit. In this example, the class AB amplifier circuit 204 is employed as an error amplifier in the low dropout regulator 200. The LDO linear regulator 200 (also referred to as LDO) generates a regulated output voltage VOUT and a load current IL. The LDO 200 includes the class AB amplifier 204 configured as an error amplifier having a reference input that receives a reference voltage VREF and a load feedback input that receives feedback LOAD FB from the regulated output voltage. The class AB error amplifier 204 generates an error output signal ERR OUT to control the regulated output voltage VOUT of the LDO linear regulator 200 based on a voltage difference between the load feedback input and the reference input. A pass device 208 has an input that receives the error output signal from the class AB error amplifier 204 and switches (with variable ON resistance) an input voltage VIN to the regulated output voltage of the LDO linear regulator based on the error output signal.

Similar to FIG. 1 above, the class AB amplifier 204 includes a differential input stage amplifier 210 receives a differential input voltage shown as VREF and LOADFB and generates an output voltage VOUT based on a difference in the differential input voltage. Feedback loops 220 are provided and can include a negative feedback loop 230 that provides feedback from an output of the differential input stage amplifier 210 to an input of the differential input stage amplifier. The negative feedback loop 230 enables class AB operation of the differential input stage amplifier 210. A positive feedback loop 240 provides feedback from an output of the differential input stage amplifier 210 to an input of the differential input stage amplifier. The positive feedback loop 240 reduces an amount of differential input voltage to initiate nonlinear operations of the differential input stage amplifier 210 with respect to changes in the differential input voltage VREF and LOADFB. One or more gain reducers shown as gain reducer 1 though N, where N is a positive integer, can be coupled to the feedback loop 220 in the differential input stage amplifier 210 to dynamically reduce the gain of the feedback loop over the dynamic range of load currents supported. The gain reducers 1 through N can be employed in either the negative feedback loop 230 and/or the positive feedback loop 240.

Figure 3:
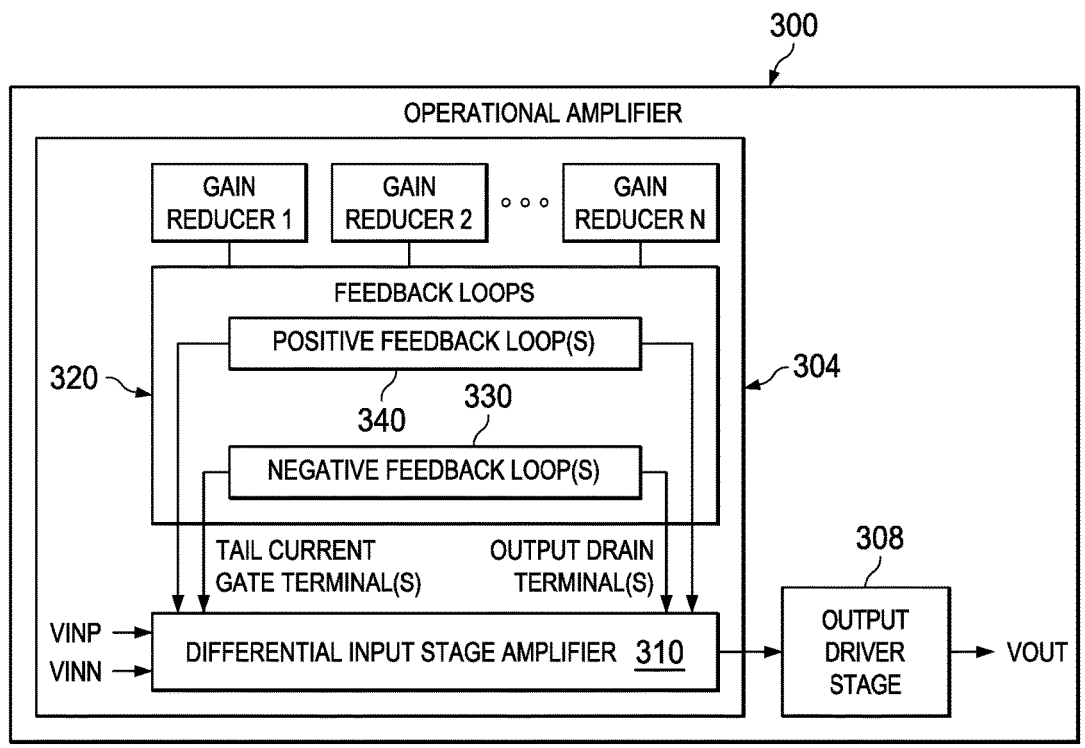
FIG. 3 illustrates an example of an operational amplifier having a class AB amplifier circuit that employs feedback loops and gain reducers to enhance stability and nonlinear operations of the circuit.

FIG. 3 illustrates an example of an operational amplifier 300 having a class AB amplifier 304 circuit that employs feedback loops and gain reducers to enhance stability and nonlinear operations of the circuit. In this example, the operational amplifier 300 includes an output driver stage 308 to amplify an output voltage from a differential input stage amplifier 310 and generate an amplified output voltage VOUT to provide an operational amplifier output. The output driver stage 308 can include a complimentary pair of transistors as will be illustrated and described below with respect to FIG. 5.

Similar to FIG. 1 and above, the class AB amplifier 304 includes the differential input stage amplifier 310 and receives a differential input voltage shown as VINP and VINN and generates an output voltage to the output driver stage 308 based on a difference in the differential input voltage. Feedback loops 320 are provided and can include a negative feedback loop 330 that provides feedback from an output of the differential input stage amplifier 310 to an input of the differential input stage amplifier. A positive feedback loop 340 provides feedback from an output of the differential input stage amplifier 310 to an input of the differential input stage amplifier. One or more gain reducers shown as gain reducer 1 though N, where N is a positive integer, can be coupled to the feedback loop 320 in the differential input stage amplifier 310 to dynamically reduce the gain of the feedback loop over the dynamic range of load currents supported. The gain reducers 1 through N can be employed in either the negative feedback loop 330 and/or the positive feedback loop 340.

Figure 4:
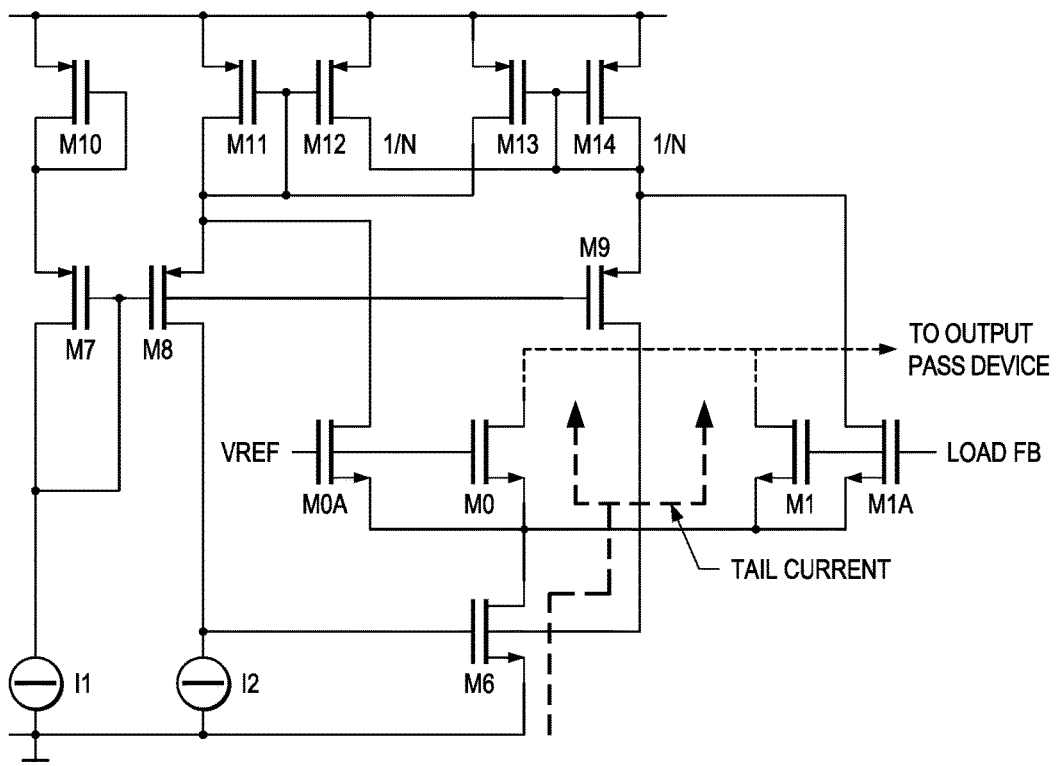
FIG. 4 illustrates a particular example of a class AB amplifier circuit utilized for a low dropout linear regulator application that employs feedback loops and gain reducers to enhance stability and nonlinear operations of the circuit.

FIG. 4 illustrates a particular example of a class AB amplifier circuit 400 that employs feedback loops and gain reducers to enhance stability and nonlinear operations of the circuit. The circuit 400 includes current sources I1 and I2. I2 drives M6 which supplies tail current collectively to transistors M0 and M1 which represent the differential amplifier previously described. Output from M0 and M1 can be utilized to drive a pass device such as described above with respect to FIG. 2, for example. Transistors M0A and M1A are placed in parallel to M0 and M1 to carry proportional sampled currents as in M0 and M1 and these receive reference input voltage VREF and feedback from the load shown as VOUT. Differences between VREF and VOUT cause the amplifier circuit 400 to leave its quiescent state. Output from M0A and M1A are connected to the source of M8 and M9 respectively. In this example, M7, M10, M11, and M14, operate as gain reducers that were previously described. The gain reducers are transistors configured as diode in these examples but regular diodes could also be employed. Transistors M12 and M13 operate in conjunction with the respective feedback loops described herein to provide positive feedback. A negative feedback loop is formed via M8, M0A, and M6. A positive feedback loop is formed via transistors M1A, M13, M8, and M6, for example.

As noted previously, the stability in class AB can be facilitated by decreasing gain by using diodes instead of resistors. At the same time, low-gain positive feedback M12 and M13 increase tail current boost at smaller input voltages differential to this differential pair. Gain of positive feedback is 1/N, where N is ratio of W/L's (width/length) between M11 and M12 and M13 and M14. With 1/N=0.25 for example, 1000× tail current boost is achieved at 100-120 mV input errors which is over a two times improvement of 300-400 mV conventional circuits.

Figure 5:
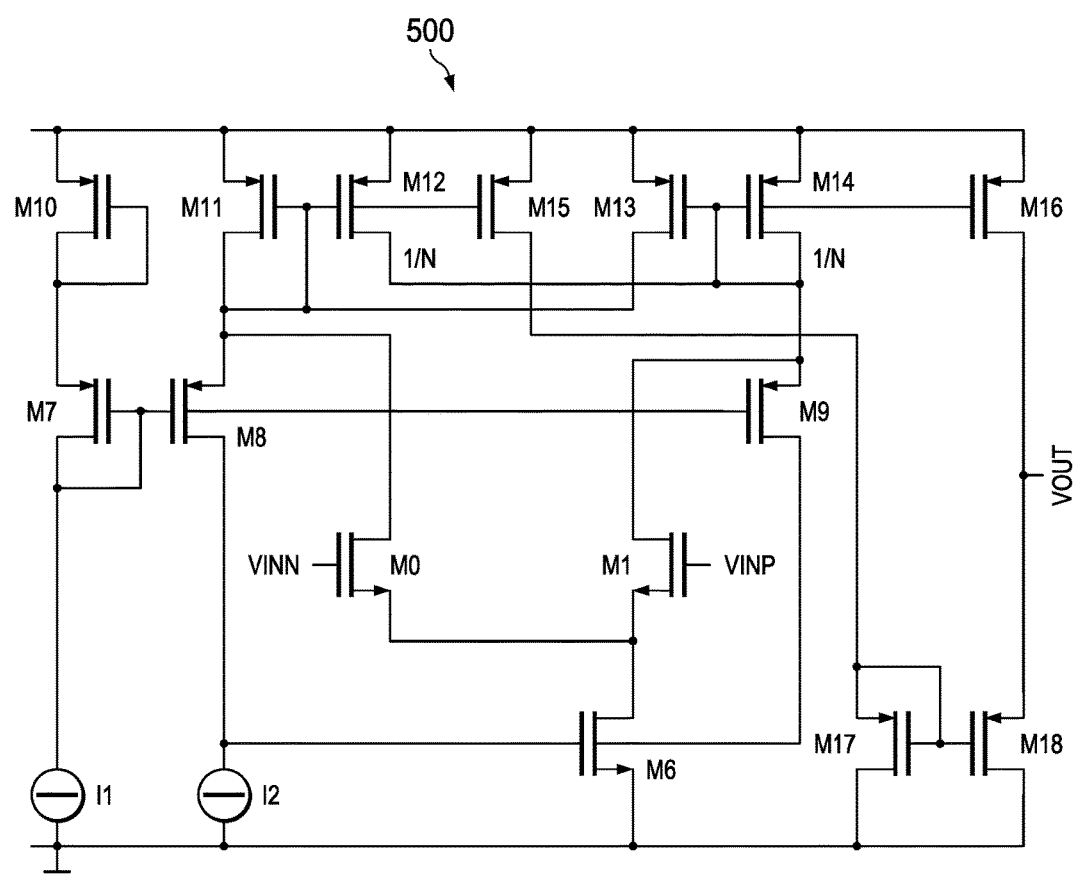
FIG. 5 illustrates an alternative example of a class AB amplifier circuit configured as an operational amplifier that employs feedback loops and gain reducers to enhance stability and nonlinear operations of the circuit.

FIG. 5 illustrates an alternative example of a class AB amplifier circuit 500 that employs feedback loops and gain reducers to enhance stability and nonlinear operations of the circuit. For purposes of brevity, each circuit component of the circuit 500 will not be described but rather the difference with respect to the circuit 400 described above. In this example, outputs from differential amplifier formed from M0 and M1 are tied internally to the source of M8 and M9 respectively. Rather than being driven in parallel to M0A and M1A as described previously, M0 and M1 are driven directly from operational amplifier inputs VINN and VINP. An output drive stage is provided that includes M16 driven from M9 (through M14) and M18 driven from M8 (through M11, M15 and M17). Gain reducer M17 is also included in the output driver stage. As shown, M16 and M18 are configured as a complimentary pair (one NPN and one PNP) with their respective drains tied to provide an output voltage VOUT.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:
1. A circuit comprising:
   a differential input stage amplifier that receives a differential input voltage and generates an output voltage based on a difference in the differential input voltage;
   a feedback loop to provide feedback from an output of the differential input stage amplifier to input tail current of the differential input stage amplifier, wherein the feedback loop enables class AB operation of the differential input stage amplifier; and
   a one gain reducer operatively coupled to the feedback loop to reduce the gain of the feedback loop, wherein the gain reducer has a resistance value that varies inversely proportional to loop current in the feedback loop to reduce the gain of the feedback loop as loop current increases;

wherein the feedback loop includes a negative feedback loop to provide feedback from an output of the differential input stage amplifier to input tail current of the differential input stage amplifier;

wherein the feedback loop includes a positive feedback loop to provide feedback from an output of the differential input stage amplifier to input tail current of the differential input stage amplifier, wherein the positive feedback loop reduces an amount of differential input voltage to initiate nonlinear operations of the differential input stage amplifier with respect to changes in the differential input voltage.

2. The circuit of claim 1, wherein a gain of the positive feedback loop is set less than the gain of the negative feedback loop.

3. The circuit of claim 2, wherein the positive feedback loop gain is set to about one fourth the gain of the negative feedback loop and boosts tail current in the differential input stage amplifier by about 1000 times with a differential input change that includes the range of about 100 mV to about 120 mV.

4. A circuit comprising:
 a differential input stage amplifier that receives a differential input voltage and generates an output voltage based on a difference in the differential input voltage;
 a feedback loop to provide feedback from an output of the differential input stage amplifier to input tail current of the differential input stage amplifier, wherein the feedback loop enables class AB operation of the differential input stage amplifier; and
 at least one gain reducer operatively coupled to the feedback loop to reduce the pain of the feedback loop, wherein the gain reducer has a resistance value that varies inversely proportional to loop current in the feedback loop to reduce the gain of the feedback loop as loop current increases;
 wherein the gain reducer is an active device that has the property of resistance specified as 1/gm, where the resistance varies inversely with the amount of current flowing through the gain reducer;
 wherein the gain reducer is a diode or a transistor configured as diode that has a resistance of 1/gm;
 wherein the circuit is configured as a low dropout linear regulator where the differential input voltages are a reference voltage and feedback supplied from an output of the regulator.

5. The circuit of claim 4, further comprising a pass device that is driven from an output of the differential input stage amplifier to regulate the output of the regulator.

* * * * *